United States Patent
Wang et al.

(10) Patent No.: US 7,436,696 B2
(45) Date of Patent: Oct. 14, 2008

(54) READ-PREFERRED SRAM CELL DESIGN

(75) Inventors: Ping-Wei Wang, Hsin-Chu (TW);
Yuh-Jier Mii, Hsin-Chu (TW);
Hung-Jen Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/582,116

(22) Filed: Oct. 17, 2006

(65) Prior Publication Data

US 2007/0253239 A1  Nov. 1, 2007

Related U.S. Application Data

(60) Provisional application No. 60/795,835, filed on Apr. 28, 2006.

(51) Int. Cl.
*G11C 11/00* (2006.01)

(52) U.S. Cl. ............ 365/154; 365/189.19; 365/189.11; 365/202; 365/205; 365/207; 365/190; 365/189.09

(58) Field of Classification Search ................ 365/154, 365/188, 156, 190
See application file for complete search history.

(56) References Cited

U.S. PATENT DOCUMENTS

| | | | |
|---|---|---|---|
| 5,075,891 A | * | 12/1991 | Yano et al. ............ 365/190 |
| 5,134,581 A | | 7/1992 | Ishibashi et al. |
| 5,212,663 A | * | 5/1993 | Leong ............ 365/189.01 |
| 5,504,705 A | * | 4/1996 | Ohkubo ............ 365/156 |
| 5,616,938 A | | 4/1997 | Bauer |
| 5,790,452 A | | 8/1998 | Lien |
| 5,939,762 A | | 8/1999 | Lien |
| 6,107,129 A | * | 8/2000 | Gardner et al. ............ 438/230 |
| 2004/0090818 A1 | * | 5/2004 | Liaw ............ 365/154 |
| 2005/0265070 A1 | | 12/2005 | Liaw |

OTHER PUBLICATIONS

Seevinck, E., et al., "Static-Noise Margin Analysis of MOS SRAM Cells," IEEE Journal of Solid-State Circuits, Oct. 1987, pp. 748-754, vol. SC-22, No. 5, IEEE.

Ichikawa, T., et al., "A New Analytical Model of SRAM Cell Stability in Low-Voltage Operation," IEEE Transactions on Electron Devices, Jan. 1996, pp. 54-61, vol. 43, No. 1, IEEE.

* cited by examiner

*Primary Examiner*—Hoai V. Ho
*Assistant Examiner*—Fernando N Hidalgo
(74) *Attorney, Agent, or Firm*—Slater & Matsil, L.L.P.

(57) ABSTRACT

A read-preferred SRAM cell includes a pull-up MOS device having a first drive current, a pull-down MOS device coupled to the pull-up MOS device, the pull-down MOS device having a second drive current, and a pass-gate MOS device having a third drive current coupled to the pull-up MOS device and the pull-down MOS device. The first drive current and the third drive current preferably have an α ratio of between about 0.5 and about 1. The second drive current and the third drive current preferably have a β ratio of between about 1.45 and 5.

18 Claims, 5 Drawing Sheets

US 7,436,696 B2

READ-PREFERRED SRAM CELL DESIGN

This application claims the benefit of U.S. Provisional Application Ser. No. 60/795,835, filed on Apr. 28, 2006, entitled "Read-Preferred SRAM Cell Design," which application is hereby incorporated herein by reference.

TECHNICAL FIELD

This invention relates generally to semiconductor devices, and more particularly to memory cells, and even more particularly to layout design and manufacturing methods of static random access memory cells.

BACKGROUND

Static random access memory (SRAM) is commonly used in integrated circuits. SRAM cells have the advantageous feature of holding data without a need for refreshing. FIG. 1 illustrates an exemplary circuit diagram of a typical six-MOS device SRAM cell, which includes pass-gate MOS devices 10 and 24, pull-up MOS devices 12 and 16, and pull-down MOS devices 14 and 18. Gates 2 and 4 of the respective pass-gate MOS devices 10 and 24 are controlled by a word-line WL that determines whether the current SRAM cell is selected. A latch formed of pull-up MOS devices 12 and 16 and pull-down MOS devices 14 and 18 stores a state. The stored state can be read through bit lines BL and BLB.

With the scaling of integrated circuits, read and write margins of the SRAM cells are reduced. Reduced read and write margins may cause errors in respective read and write operations when the read and write operations are affected by static noise. Conventionally, to improve the read and write margins, dynamic powers are provided. For example, the write margin can be improved by increasing bitline voltage and/or reducing power supply voltage VDD during the write operations, while the read margin can be improved by reducing bitline voltage and/or increasing power supply voltage VDD during the read operations. However, such a solution suffers drawbacks. Complicated circuits have to be designed to provide dynamic power for both read and write operations. Additionally, it takes time for the dynamic powers to be generated, and thus the read and write operations are slowed down.

Accordingly, a new SRAM device, having improved read and write margins while at the same time overcoming the deficiency of the prior art, is needed.

SUMMARY OF THE INVENTION

In accordance with one aspect of the present invention, a read-preferred SRAM cell includes a pull-up MOS device having a first drive current, a pull-down MOS device coupled to the pull-up MOS device, the pull-down MOS device having a second drive current, and a pass-gate MOS device having a third drive current coupled to the pull-up MOS device and the pull-down MOS device. The first drive current and the third drive current preferably have an α ratio of between about 0.5 and about 1. The second drive current and the third drive current preferably have a β ratio of between about 1.45 and 5.

In accordance with another aspect of the present invention, a read-preferred SRAM cell includes a first pull-up PMOS device, a first pull-down NMOS device wherein a source of the first pull-up PMOS device is electrically coupled to a source of the first pull-down NMOS device, a second pull-up PMOS device electrically coupled to the first pull-up PMOS device and the first pull-down NMOS device, a second pull-down NMOS device wherein a source of the second pull-up PMOS device is electrically coupled to a source of the second pull-down NMOS device. The first and the second pull-up PMOS devices and the first and the second pull-down NMOS devices form a latch. The read-preferred SRAM cell further includes a pass-gate MOS device electrically coupled to the source of the first pull-up PMOS device. At least one pair of the first and the second pull-up PMOS devices and one pair of the first and the second pull-down NMOS devices preferably have asymmetric implantation regions.

In accordance with yet another aspect of the present invention, a read-preferred SRAM cell includes at least two pull-up MOS devices, at least two pull-down MOS devices coupled to the at least two pull-up MOS devices, and at least two pass-gate MOS devices coupled to the at least two pull-up MOS devices and the at least two pull-down MOS devices. The SRAM cell preferably has a static read margin and a static write margin, wherein the static read margin is substantially greater than the static write margin.

In accordance with yet another aspect of the present invention, a method for operating a static random access memory (SRAM) cell includes forming a SRAM cell having a static read margin and a static write margin wherein the static read margin is substantially greater than the static write margin, providing a dynamic power for write operations of the SRAM cell, and providing a static power for read operations of the SRAM cell.

The advantageous features of the present invention include an improved read margin, less complicated dynamic power circuits, and a faster access speed for SRAMs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

It has been found that the static-noise margin (SNM), which affects both read margin and write margin, is related to the threshold voltages of the NMOS and PMOS devices in SRAM cells. Typically, to increase the SNM, the threshold voltages of the NMOS and PMOS devices need to be increased. However, the increase in the threshold voltages of PMOS and NMOS devices is limited. The reason is that SRAM cells with MOS devices having too high threshold voltages are difficult to operate, as it is hard to flip the operation of the MOS devices. Additionally, the requirements of the improvement in the read margin and the write margin are typically conflicting. The improvement in the write margin will typically cause the degradation of the read margin, and vice versa.

In the preferred embodiments of the present invention, SRAM cells with a high read margin are formed. The respective SRAM cells are thus referred to as read-preferred SRAM cells. The improvement in the read margin, however, tends to cause a degradation in the write margin. Dynamic power is thus provided only for write operations to improve the write margin.

Figure 1:
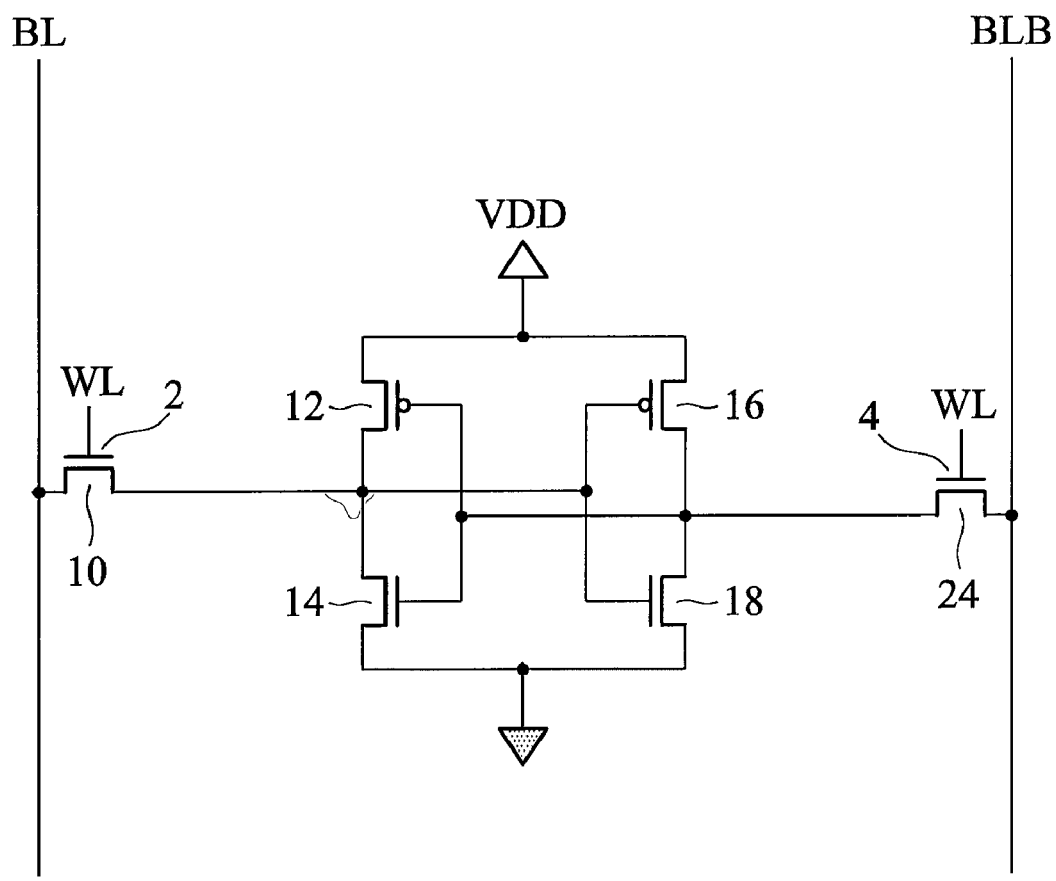
FIG. 1 illustrates a conventional six-MOS device SRAM cell.
Figure 2:
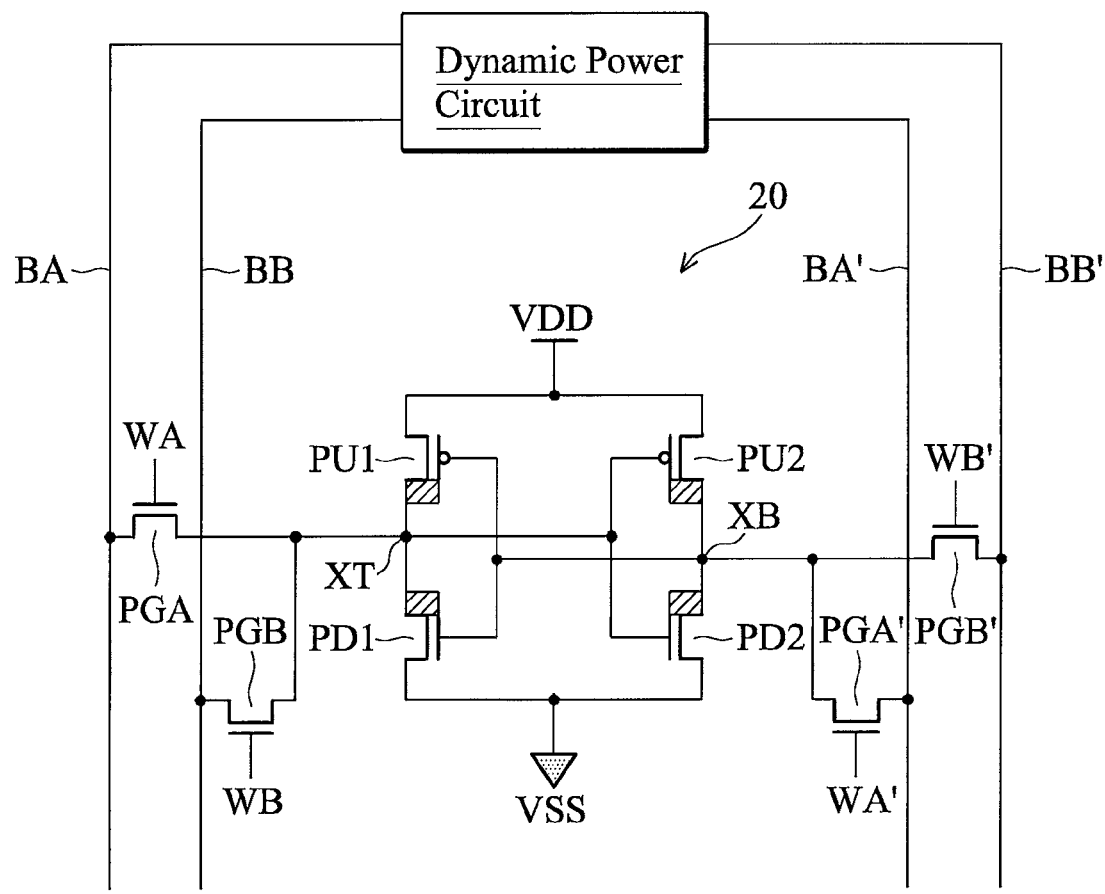
FIG. 2 illustrates an eight-MOS device SRAM cell, wherein pull-up and pull-down MOS devices have asymmetric structures.

FIG. 2 illustrates a circuit diagram of a preferred SRAM cell 20, which includes two pull-up PMOS devices PU1 and PU2 and two pull-down NMOS devices PD1 and PD2. Pull-up PMOS devices PU1 and PU2 and pull-down NMOS devices PD1 and PD2 are coupled to power supply nodes VDD and VSS. Node XT, which connects the sources of MOS devices PU1 and PD1, is also connected to a first bitline BA through a pass-gate MOS device PGA, and to a second bitline BB through a pass-gate MOS device PGB, wherein bitlines BA and BB provide different bitline voltages (hence dynamic) for read and write operations. Similarly, node XB, which connects the sources of MOS devices PU2 and PD2, is connected to a first bitline BA' through a pass-gate MOS device PGA', and to a second bitline BB' through a pass-gate MOS device PGB', wherein bitlines BA' and BB' provide different bitline voltages for read and write operations. Throughout the description, the symbol "'" is suffixed to a line/node numeral to indicate that a signal/voltage on a line/node has a substantially reversed phase with the respective line/node marked without the symbol.

A dynamic power circuit is preferably connected to bitlines BA, BA, BB and BA'. During write operations, the dynamic power circuit provides dynamic power to improve the write margin. During read operations, the dynamic power circuit provides a static power, which is preferably the same as the operation voltage supply for other circuits on the same chip. The selection of different bitline voltages are performed either by setting wordlines WA and WA' to high and wordlines WB and WB' to low, or by setting wordlines WB and WB' to high and wordlines WA and WA' to low. For example, during a write operation, the wordlines WA and WA' have high voltages, and thus pass-gate MOS devices PGA and PGA' are turned on, and the voltages on bitlines BA and BA' are used for the write operation. For read operations, the wordlines WB and WB' have high voltages, and thus pass-gate MOS devices PGB and PGB' are on, and the voltages on bitlines BB and BB' are used for the read operations. In this example, the magnitude of voltages provided through bitlines BA and BA' is preferably increased over voltages provided on bitlines BB and BB'. Although not illustrated, the dynamic power circuit may further supply dynamic power supply voltages, preferably using MOS devices controlled by wordlines WA, WA', WB and WB'. Contrary to the bitline voltages, the power supply voltage for write operations is preferably lower than the power supply voltage for read operations.

Preferably, SRAM cell 20 is designed to be read-preferred by increasing the α ratio and/or the β ratio. An α ratio is defined as a ratio of the drive current $I_{dsat}$ of a pull-up MOS device PU1 or PU2 to the drive current $I_{dsat}$ of a pass-gate device PGA, PGB, PGA' or PGB'. A β ratio is defined as the drive current $I_{dsat}$ of a pull-down MOS device PD1 or PD2 to the drive current $I_{dsat}$ of a pass-gate device PGA, PGB, PGA' or PGB'. Preferably, α ratio is between about 0.5 and 1, and more preferably between about 0.5 and 0.8, and even more preferably between about 0.6 and about 0.7. Further, α ratio can be even greater than about 1, for example, between about 1 and 2. β ratio is preferably between about 1.45 and 5, and more preferably between about 1.6 and 3, and even more preferably between about 1.8 and about 2.5. Further, β ratio can be even greater than about 5, for example, between about 1 and 8.

In a first embodiment, the increase in the α ratio and/or β ratio is achieved by increasing the physical width-to-length ratios (also referred to as W/L ratios) of the pull-down and/or pull-up MOS devices, respectively. In an exemplary embodiment, the W/L ratios of the pull-down MOS devices PD1 and PD2 and the W/L ratios of the pass-gate MOS devices PGA, PGB, PGA', and/or PGB' preferably have ratios of between about 1.8 and 5. In another exemplary embodiment formed using 90 nm technology, pull-down MOS devices PD1 and PD2 have a gate width of about 180 nm and a gate length of about 100 nm, while pass-gate MOS devices PGA, PGB, PGA', and PGB' have a gate width of about 120 nm and a gate length of about 115 nm. The resulting W/L ratios of the pull-down MOS devices PD1 and PD2 and the W/L ratios of the pass-gate MOS devices PGA, PGB, PGA', and/or PGB' have α ratio of 1.725.

In a second embodiment, the increase in the α ratio and β ratio is achieved by weakening pass-gate MOS devices PGA, PGB, PGA', and/or PGB', and thus reducing their device drive currents. This may be achieved by reducing the W/L ratios of the respective pass-gate MOS devices. In addition, weakening the pass-gate MOS devices can be achieved either by skipping process steps commonly used for improving MOS devices, or adopting methods such as forming stressed ILD layer for pass-gate NMOS devices.

In a third embodiment, the increase in the α ratio and/or β ratio is achieved by forming asymmetric pull-up MOS devices PU1, PU2 and/or pull-down MOS devices PD1 and PD2. Referring back to FIG. 2, shaded rectangles are marked adjacent the source regions of the pull-up and pull-down MOS devices, symbolizing that respective MOS devices are asymmetric MOS devices.

Figure 3:
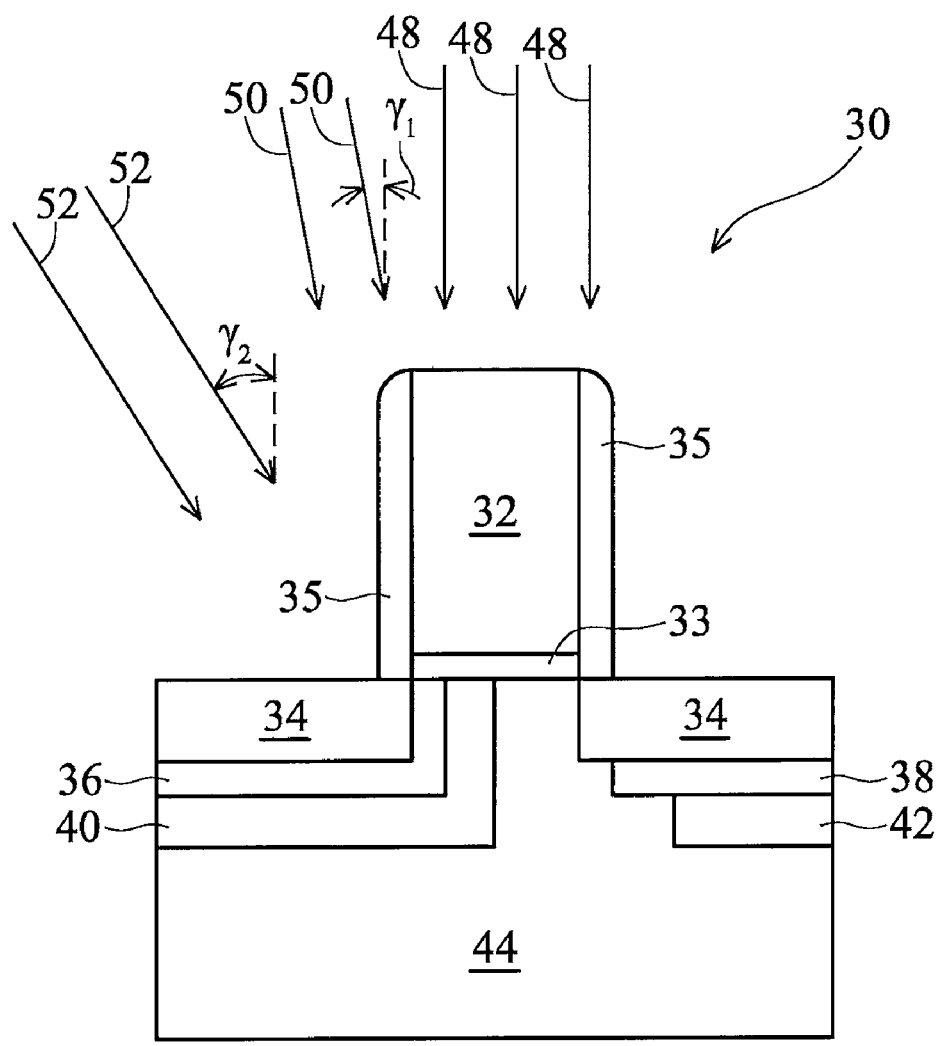
FIG. 3 illustrates an exemplary embodiment for forming an asymmetric MOS device.

An exemplary embodiment of an asymmetric MOS device 30 is shown in FIG. 3. MOS device 30 includes a gate electrode 32 on a gate dielectric 33, gate spacers 35 on sidewalls of the gate electrode 32 and gate dielectric 33, lightly-doped source/drain (LDD) regions 34, and pocket regions 36, 38, 40 and 42 in substrate 44. The illustrated MOS device 30 has asymmetric structures on the source side and drain side. An exemplary formation process is described as follows.

First, semiconductor substrate 44 is provided. A gate structure including a gate electrode 32 and a gate dielectric 33 is formed on semiconductor substrate 44, followed by the implantation of LDD regions 34. LDD implantation, which is symbolized by arrows 48, is preferably performed at a tilt angle of about 0 degrees (and thus is vertical). Pocket regions 36, 38, 40 and 42, which have an opposite conductivity type from LDD regions 34, are then implanted. A first pocket implantation, which is symbolized by arrows 50, forms pocket regions 36 and 38. In an exemplary embodiment, the tilt angle $\gamma_1$ is about 10 degrees, and a twist angle (not shown) is about 0 degrees. The tilting is preferably from the source side toward the drain side. Due to the masking of gate electrode 32, the resulting source pocket region 36 extends under gate electrode 32 further than drain pocket region 38, which may be spaced apart from a respective edge of gate electrode 32. A second pocket implantation, which is symbolized by arrows 52, is performed to form pocket regions 40 and 42. The second pocket implantation may be performed at, for example, a tilt angle $\gamma_2$ of about 40 degrees and a twist angle (not shown) of about 45 degrees. Next, gate spacers 35 are formed, and source/drain regions (not shown) are also formed. The asymmetric MOS devices have higher device drive currents. Therefore, by forming asymmetric pull-down and/or pull-up MOS devices, the $\alpha$ ratio and/or $\beta$ ratio is increased. For process convenience, pull down MOS devices can also have asymmetric structures.

Please note that the above-discussed method for forming asymmetric MOS devices is only an exemplary embodiment. Different approaches may be taken to form different asymmetric MOS devices in order to improve the drive currents.

Figure 4:
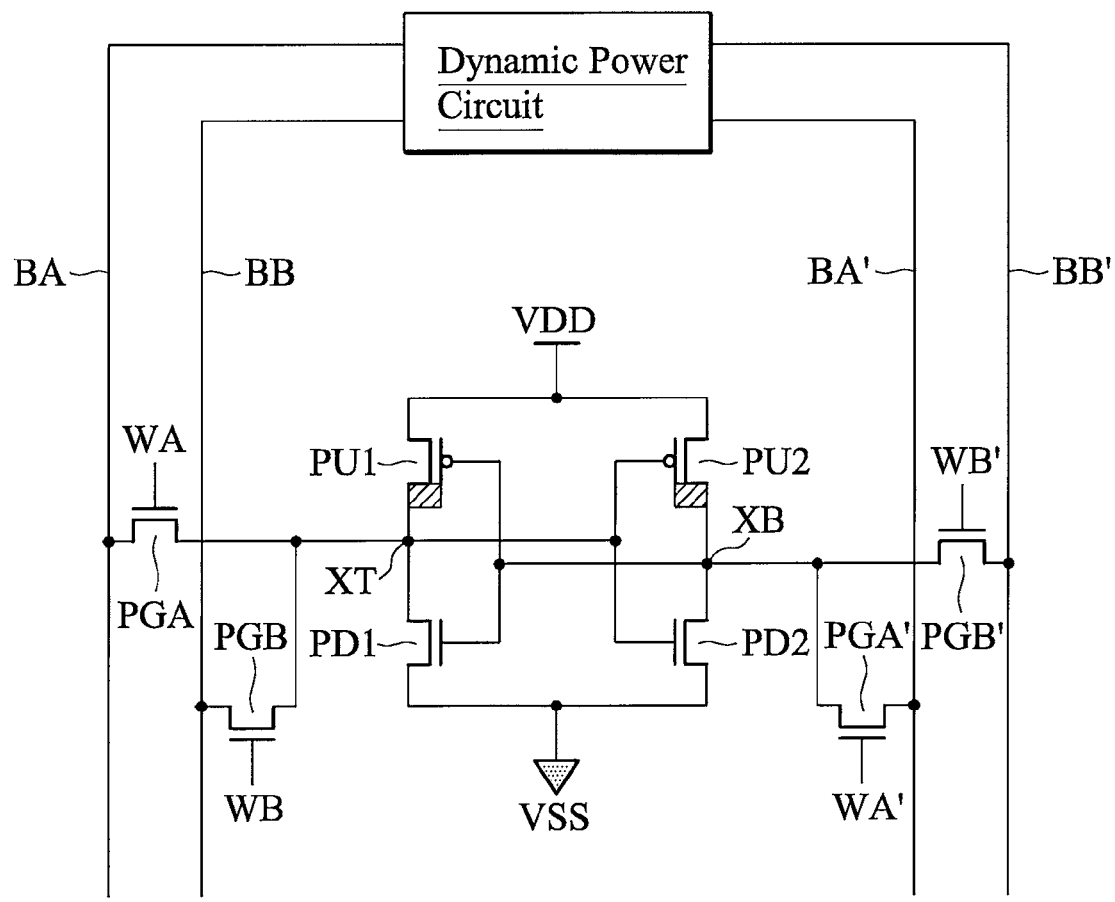
FIG. 4 illustrates an eight-MOS device SRAM cell, wherein only pull-up MOS devices have asymmetric structures.

FIG. 4 illustrates another embodiment of the present invention, wherein the illustrated SRAM cell is similar to what is shown in FIG. 2, except that only pull-up MOS devices PU1 and PU2 are asymmetric, while pull-down MOS devices PD1 and PD2 are symmetric. In alternative embodiments (not shown), only pull-down MOS devices PD1 and PD2 are asymmetric, while pull-up MOS devices PU1 and PU2 are symmetric.

In yet other embodiments, the increase in the $\alpha$ ratio and/or $\beta$ ratio can be achieved by using other commonly used methods that can improve device drive currents. For example, SiGe stressors can be formed for pull-up devices PU1 and PU2 to improve their drive currents, while SiC stressors can be formed for pull-down devices PD1 and PD2 to improve their drive currents. Additional methods for improving $\alpha$ ratio and/or $\beta$ ratio include forming stressed contact etch stop layers for MOS devices.

The SRAM cells formed using the preferred embodiments of the present invention are read-preferred, partly because that the SRAM cells have a read margin that is higher than the write margin if no dynamic power is applied. Throughout the description, the terms "static read margin" and "static write margin" are used to refer to the read margin and write margin of the SRAM cell assuming no dynamic power is provided. In one embodiment, the static read margin is preferably greater than the static write margin by about 10 mV to about 200 mV, and more preferably by about 50 mV. In other embodiments, the static write margin is less than about 50 percent, and more preferably less than about 20 percent of the static read margin. In yet other embodiments, the static write margin is close to zero, which means there is no static write margin. Since the improvement in the static read margin tends to cause a reduction of the static write margin, in an exemplary embodiment, the static read margin may be greater than about 300 mV, while the static write margin is less than about 100 mV. By providing dynamic power for writing operations, the write margin (referred to as dynamic write margin hereinafter) of the SRAM cells operate under dynamic power can also be improved to a desired level, preferably comparable to the static read margin.

Figure 5:
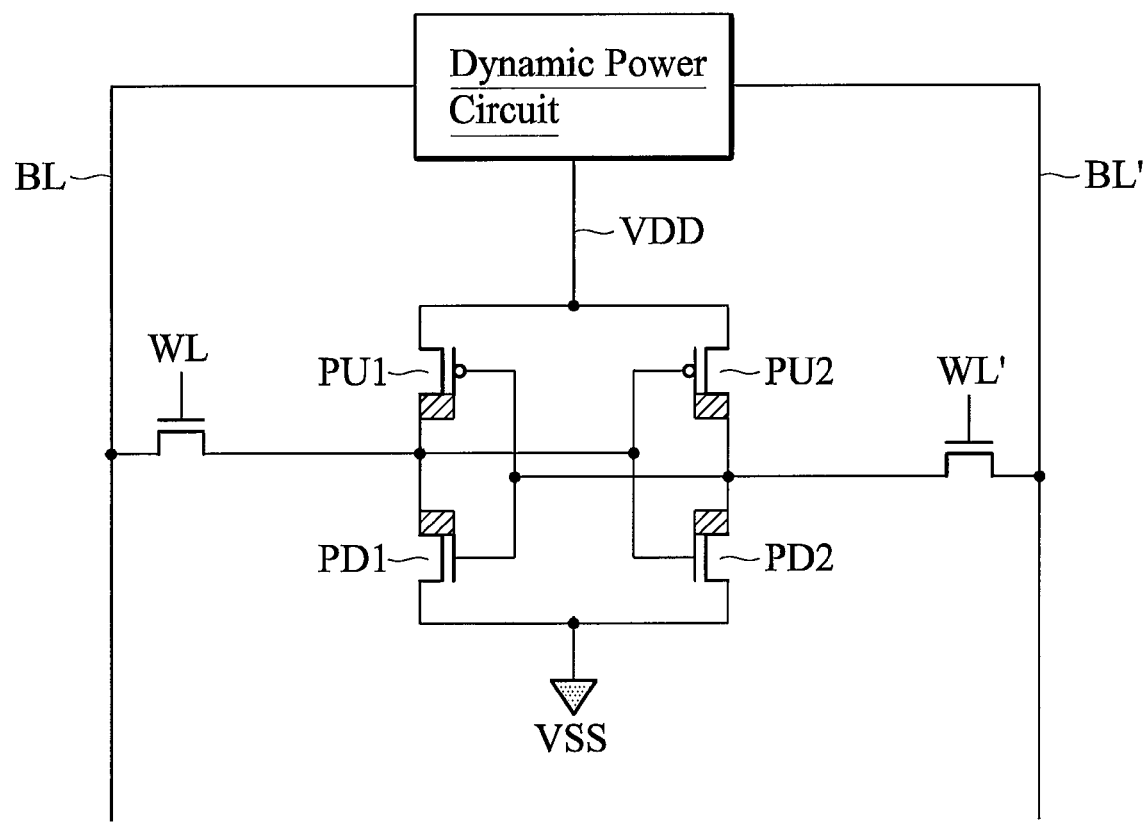
FIG. 5 illustrates a six-MOS device SRAM cell, wherein pull-up and pull-down MOS devices have asymmetric structures.

As is commonly known in the art, SRAM cells have many variations, for example, six MOS devices (6T), 8 MOS device (8T), 12 MOS devices (12T) and 14 MOS devices (14T) are commonly used SRAM structures. The previously provided teaching is readily available for SRAM cells having different numbers of MOS devices. FIG. 5 illustrates a 6T embodiment, wherein only two pass-gate MOS devices are included in the SRAM cell. Dynamic power for write operations and static power for read operations are provided through the same bitlines BL and BL' and voltage supply node VDD, depending on the operations being performed.

The preferred embodiments of the present invention have several advantageous features. First, the SNM of the SRAM cells are improved. Experimental results have shown that by forming asymmetrical pull-up MOS devices PU1 and PU2 and pull-down devices PD1 and PD2, the SNM in the read operations have been improved by about seven percent. In typical SRAM operations, the number of read operations exceeds the number of write operations. Without the need of providing dynamic power, read operations are faster, and the overall speed of the SRAM cells is increased. A further advantageous feature of the preferred embodiments of the present invention is that the circuits for providing dynamic powers are less complicated since only the write operations need dynamic power.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a static random access memory (SRAM) cell comprising:
   a pull-up MOS device having a first drive current;
   a pull-down MOS device coupled to the pull-up MOS device, the pull-down MOS device having a second drive current; and
   a pass-gate MOS device having a third drive current coupled to the pull-up MOS device and the pull-down MOS device, wherein the first drive current and the third drive current have an $\alpha$ ratio of between about 0.5 and about 1, and wherein the second drive current and the third drive current have a $\beta$ ratio of between about 1.45 and about 5; and
   a dynamic power circuit coupled to the SRAM cell, wherein the dynamic power circuit is configured to provide a dynamic bitline voltage for write operations of the SRAM cell, and to provide a static bitline voltage for read operations of the SRAM cell, and wherein the dynamic bitline voltage is higher than the static bitline voltage.

2. The semiconductor structure of claim 1, wherein the $\alpha$ ratio is between about 0.6 and about 0.7.

3. The semiconductor structure of claim 1, wherein the $\beta$ ratio is between about 1.8 and about 2.5.

4. The semiconductor structure of claim 1, wherein at least one of the pull-up MOS device and the pull-down MOS device has an asymmetric structure.

5. The semiconductor structure of claim 1, wherein both the pull-up MOS device and the pull-down MOS device have asymmetric structures.

6. The semiconductor structure of claim 1, wherein the pull-down MOS device has a first width-to-length (W/L) ratio, the pass-gate MOS device has a second W/L ratio, and wherein the first W/L ratio and the second W/L ratio have a ratio of between about 1.8 and about 5.

7. A static random access memory (SRAM) cell comprising:

a first pull-up PMOS device;
a first pull-down NMOS device, wherein a source/drain region of the first pull-up PMOS device is electrically coupled to a source/drain region of the first pull-down NMOS device;
a second pull-up PMOS device electrically coupled to the first pull-up PMOS device and the first pull-down NMOS device;
a second pull-down NMOS device, wherein a source/drain region of the second pull-up PMOS device is electrically coupled to a source/drain region of the second pull-down NMOS device, and wherein the first and the second pull-up PMOS devices and the first and the second pull-down NMOS devices form a latch; and
a pass-gate MOS device electrically coupled to the source/drain region of the first pull-up PMOS device,
wherein at least one of the first and the second pull-up PMOS devices and the first and the second pull-down NMOS devices has asymmetric source and drain pocket regions wherein the asymmetric source and drain pocket regions of the first and second pull-up PMOS devices are n-type, and wherein the asymmetric source and drain pocket regions of the first and second pull-down NMOS devices are p-type; and a dynamic power circuit coupled to the SRAM cell, wherein the dynamic power circuit is configured to provide a dynamic bitline voltage for write operations of the SRAM cell and to provide a static bitline voltage for read operations of the SRAM cell, and wherein the dynamic bitline voltage is higher than the static bitline voltage.

8. The SRAM cell of claim 7, wherein an $\alpha$ ratio of the SRAM cell is between about 0.5 and about 1, and wherein a $\beta$ ratio of the SRAM cell is between about 1.45 and 5.

9. The SRAM cell of claim 7, wherein each of the first and the second pull-up PMOS devices has the asymmetric source and drain pocket regions.

10. The SRAM cell of claim 7, wherein each of the first and the second pull-down NMOS devices has the asymmetric source and drain pocket regions.

11. The SRAM cell of claim 8, wherein each of the first and the second pull-up PMOS devices and the first and the second pull-down NMOS devices has asymmetric source and drain pocket regions.

12. A static random access memory (SRAM) cell comprising:
at least two pull-up MOS devices;
at least two pull-down MOS devices coupled to the at least two pull-up MOS devices; and
at least two pass-gate MOS devices coupled to the at least two pull-up MOS devices and the at least two pull-down MOS devices,
wherein the SRAM cell has a static read margin and a static write margin, and wherein the static read margin is substantially greater than the static write margin a dynamic power circuit coupled to the SRAM cell, wherein the dynamic power circuit is configured to provide a dynamic bitline voltage for write operations of the SRAM cell, and to provide a static bitline voltage for read operations of the SRAM cell, and wherein the dynamic bitline voltage is higher than the static bitline voltage.

13. The SRAM cell of claim 12, wherein the static read margin is greater than the static write margin by about 50 mV.

14. The SRAM cell of claim 12, wherein the static write margin is less than about 50 percent of the static read margin.

15. The SRAM cell of claim 12, wherein the static write margin is less than about 100 mV, and the static read margin is greater than about 300 mV.

16. The SRAM cell of claim 15, wherein the static write margin is less than about 0 mV.

17. The SRAM cell of claim 12, wherein when operated under a dynamic power, the SRAM cell has a dynamic write margin substantially close to the static read margin.

18. The semiconductor structure of claim 1, wherein the SRAM cell has a static write margin, a static read margin, and a dynamic write margin obtained using the dynamic power circuit, wherein the static write margin is less than about 50 percent of the static read margin, and wherein the dynamic write margin is comparable to the static read margin.

* * * * *

UNITED STATES PATENT AND TRADEMARK OFFICE
CERTIFICATE OF CORRECTION

| | |
|---|---|
| PATENT NO. | : 7,436,696 B2 |
| APPLICATION NO. | : 11/582116 |
| DATED | : October 14, 2008 |
| INVENTOR(S) | : Wang et al. |

It is certified that error appears in the above-identified patent and that said Letters Patent is hereby corrected as shown below:

In Col. 3, line 31, delete ""''"" and insert --"''"--.
In Col. 8, line 1, delete "8" and insert --7--.
In Col. 8, line 3, after has insert --the--.

Signed and Sealed this

Ninth Day of December, 2008

JON W. DUDAS
*Director of the United States Patent and Trademark Office*